July 6, 1965 HIROE OSAFUNE ETAL 3,193,738

COMPOUND SEMICONDUCTOR ELEMENT AND MANUFACTURING PROCESS THEREFOR

Filed April 24, 1961

INVENTORS
HIROE OSAFUNE
ICHIEMON SASAKI
BY Roy C. Hapgood
ATTORNEY 3,193,738

COMPOUND SEMICONDUCTOR ELEMENT AND MANUFACTURING PROCESS THEREFOR

Hiroe Osafune and Ichiemon Sasaki, Tokyo, Japan, assignors to Nippon Electric Company Limited, Tokyo, Japan, a corporation of Japan Filed Apr. 24, 1961, Ser. No. 104,985
Claims priority, application Japan, Apr. 26, 1960, 35/22,671
5 Claims. (Cl. 317—234)

This invention relates in general to multiple junction semiconductor elements which contain a plurality of PN or NP junction and more particularly to compound semiconductor elements where the word "compound" is defined to indicate the presence of two physically distinct sequences of semiconductor junctions in a single semiconductor device where one or more of the junctions thereof are common to both sequences therein. The invention also relates to a method for manufacturing compound semiconductor elements as defined above and to electrical circuit arrangements for utilizing the novel characteristics of these compound semiconductor elements.

In the past, multiple junction semiconductor elements have been manufactured by a serial technique in which a sequence of three or more separate conductivity regions is formed in a semiconductor material in accordance with predetermined physical dimensions and electrical characteristics to form a plurality of serially disposed PN or NP junction groups. The NPN or PNP junction transistor and the NPNP or PNPN junction transistor are familiar examples of these prior art devices, each of which has its own inherent electrical characteristics, and each of which is best adapted to perform certain functions in an electrical circuit according to its particular electrical characteristics, as well known to those skilled in the art.

In accordance with this invention, however, it has been found that an entirely new class of multiple junction semiconductor devices can be provided by combining two or more of these prior art devices in a single, integrated structure containing two or more physically distinct junction sequences which contain one or more common junctions. This new class of multiple junction semiconductor devices, which are defined as "compound" multiple junction semiconductor devices in this document, combine the electrical characteristics of these formerly separate prior art devices to produce a single, integrated semiconductor device having enirely novel electrical characteristics. For example, in one specific embodiment of the invention described herein a prior art PNP transistor is combined with a prior art NPNP transistor in a three terminal semiconductor device which can be used to perform electrical functions which were hitherto impossible with a single semiconductor device.

Accordingly, one object of this invention is to provide a new class of multiple junction semiconductor devices which combine the electrical characteristics of two or more prior art devices in a single, integrated structure.

Another object of this invention is to provide a class of compound multiple junction semiconductor elements which contain two physically distinct sequences of semiconductor junctions in which one or more of the junctions is common to each sequence thereof. An additional object of this invention is to provide a method for manufacturing compound multiple junction semiconductor elements as defined above.

A further object of this invention is to provide electrical circuit arrangements for utilizing the novel characteristics of compound semiconductor devices.

Other objects and advantages of the invention will become apparent to those skilled in the art from the following description of one specific embodiment thereof, as illustrated in the attached drawings, in which.

Although the compound multiple junction semiconductor device of this invention can be manufactured by any suitable technique, it is preferable to employ the two-stage heat-treat process as described in co-pending application Serial No. 104,984 which was filed on April 24, 1961 for "Method of Manufacturing Multiple Junction Semiconductor Elements." In accordance with the method described in said co-pending application, multiple junction semiconductor devices are formed by placing a doped semiconductor material in contact with a metallic material which contains both N type and P type impurities in unequal amounts and then fusing the two materials together in a two-stage heating process. In the first stage of the heat treating process, the two materials fuse together to form a re-crystalized region in which the impurities from the metallic material are distributed in accordance with their concentration in the metallic material. In the second stage, the impurities are diffused out of the re-crystalized region into the semiconductor material, and they are separated into separate regions in accordance with the different diffusion rates for N and P type impurities in semiconductor materials. This particular process lends itself very nicely to the manufacture of compound multiple junction semiconductor elements, as will become more apparent from the examples which follow.

Figures 1, 3:
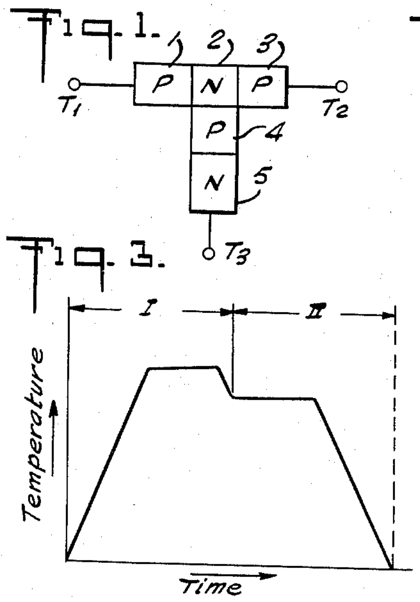
FIG. 1 is a schematic representation of one particular compound multiple junction semiconductor device according to this invention.
FIG. 3 is a temperature-time curve of one illustrative heat-treating cycle for producing the semiconductor element of FIG. 2C.

FIG. 1 is a schematic representation of one illustrative embodiment of the invention in which an N type region 2 and a P type region 3 are formed in cascade on a P type wafer 1, thereby forming a PNP junction transistor. Terminals $T_1$ and $T_2$ are connected to P type regions 1 and 3 respectively to form the emitter and collector electrodes of the PNP transistor. The base region 2, however, is coupled to a P type region 4, which in turn is coupled to an N type region 5 that terminates in a third terminal $T_3$. It can be seen that an NPNP junction sequence is formed between $T_1$ and $T_3$ or between $T_2$ and $T_3$, and that this NPNP junction sequence has one N type region and one P type region in common with the PNP junction sequence between $T_1$ and $T_2$.

Figure 2A:
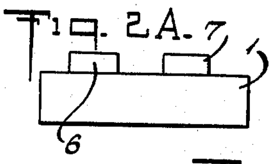
FIG. 2A is an elevation section showing one illustrative arrangement of material for producing the device of FIG. 1 in a two-stage heat-treating cycle.
Figure 2B:
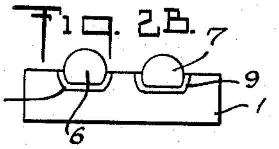
FIG. 2B is an elevation section showing the materials of FIG. 2A after they have been subjected to phase I of the heat-treating cycle.
Figure 2C:
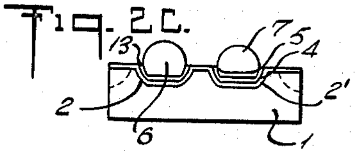
FIG. 2C is an elevation section showing the materials of FIG. 2B after they have been subjected to phase II of the heat-treating cycle.

The device shown in FIG. 1 is preferably manufactured in accordance with the process illustrated in FIGS. 2 and 3. In the first step of this process (FIG. 2A), a P type germanium wafer 1 is placed in contact with two metallic materials 6 and 7. Metals 6 and 7 contain large concentrations of both P and N type impurities in unequal amounts. These metallic materials can comprise a carrier metal which has been contaminated with both types of impurities, or they can comprise alloys which contain the desired balance of impurities. For example, material 6 can comprise 94% lead (by weight), 3% antimony, and 3% gallium (or 90% indium and 10% antimony) and material 7 can comprise 97% indium and 3% arsenic.

In stage I of the heat treating process (FIG. 3), the materials 1, 6, and 7 are heated to a predetermined alloying temperature and maintained at that temperature long enough to form recrystallized regions 8 and 9 at the junction of semi-conductor material 1 and metallic materials 6 and 7. Recrystalized regions 8 and 9 contain the concentration of impurities corresponding to the composition and the distribution coefficients of the metallic materials, which means that region 8 is P in type and region 9 N in type in the above specific embodiment. (Therefore P and N type metallic materials mean the materials 6 and 7 respectively).

In stage II of the heat treat cycle, the temperature is dropped slightly to a predetermined diffusion temperature, and the impurities in the recrystalized regions are separated out by diffusion into germanium wafer 1. (The temperature can be held at the stage I level if desired during stage II, but a slightly lower temperature will produce superior results and is therefore preferable.) Since the N type impurities diffuse faster in germanium than the P type impurities, they will penetrate further into the wafer 1 than the P type impurities and will form N type regions 2 and 2′ which are joined together between materials 6 and 7. Regions 2 and 2′, taken together, form the N type region 2 in the schematic diagram of FIG. 1. It should be noted at this point that materials 6 and 7 must be placed close enough to each other so that regions 2 and 2′ will overlap but not close enough for recrystalized regions 8 and 9 to overlap. The exact placement will, of course, depend on the particular materials used in any given embodiment of the invention and the specific heat treating cycle employed, as will be readily understood by those skilled in the art.

When the N type impurities diffuse out of their respective recrystalization regions they leave P type regions 3 and 4 behind them. And since the region 9 is N in type, an N type region 5 is formed behind P type region 4. This produces the device represented by the schematic symbol of FIG. 1. After the heat treat cycle has been completed, the excess material in wafer 1 is preferably removed as indicated by the dotted lines in FIG. 2. Terminals $T_1$, $T_2$, and $T_3$ are then attached to materials 1, 6, and 7 respectively to form the finished product.

Figure 5:
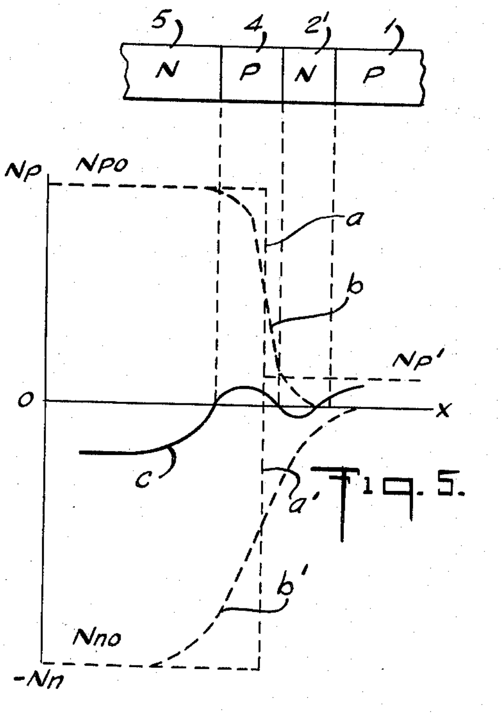
FIG. 5 is a graph showing the concentration of majority carriers along the NPNP sequence of junction in the device of FIGS. 1 and 2C.
Figure 4:
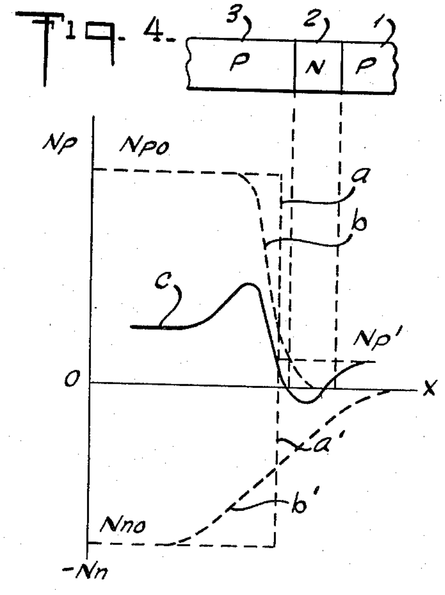
FIG. 4 is a graph showing the distribution of majority carriers along the PNP sequence of junctions in the device of FIG. 1 and FIG. 2C.
Figure 7:
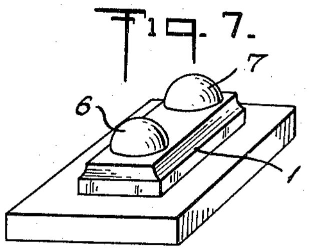
FIG. 7 is a perspective view of the semiconductor device of FIG. 2C.

FIGS. 4 and 5 show the distribution of impurities along the PNP and NPNP junction sequences at the end of stage I in the heat treat cycle and at the end of stage II thereof. In both graphs the positive ordinate $N_p$ indicates the concentration of P type impurities and the negative ordinate $N_n$ represents the concentration of the N type impurities. The abscissa X represents physical position along the expanded conductivity regions appearing above each graph. The dotted lines $N_{p0}$ and $N_{n0}$ indicate the concentration of impurities in the recrystalized regions, and dotted line $Np'$ indicates the concentration of N type impurities in material 1. The dotted curves $a$ and $a'$ show the concentration of impurities after stage I of the heat treat cycle, and the dotted curves $b$ and $b'$ show the concentration of impurities after stage II of the heat treat cycle. The solid curves $c$ show the resultant of curves $b$, $b'$, and $Np'$. It will be understood by those skilled in the art that solid curves $c$ define the net or overall concentration of impurities along their respective sections of the compound semiconductor.

It should be noted here that the logical complement of the above described semiconductor device could be formed by replacing the P type germanium wafer 1 with an N type silicon wafer. Since the P type impurities diffuse faster in silicon than the N type impurities, this would invert the conductivity type in each of the regions shown to produce an NPN junction sequence and a PNPN junction sequence. It should be also noted that two PNP junction sequences could be formed by using P type metallic material for material 7 as well as for material 6, instead of the N type material described above.

Figure 6:
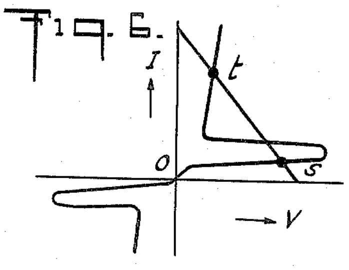
FIG. 6 is the current versus voltage characteristics of the NPNP junction sequence of the device shown in FIGS. 1 and 2C.

The compound multiple junction semiconductor device described above can be used in many circuit applications to perform functions which were hitherto impossible with a single semiconductor device. For example, the device can be used as a combination switch-amplifier by using $T_1$ and $T_3$ as input terminals and $T_1$ and $T_2$ as output terminals. In this circuit arrangement the PNP junctions act as an amplifier and the NPNP junctions act as a switch. This combined operation can be best explained with reference to FIG. 6, which shows the voltage versus current characteristics for the NPNP junction sequence between input terminals $T_1$ and $T_3$ and the load line for an input load resistor in series with the input circuit. In this circuit arrangement the NPNP junction is preferably biased to operate at some point $s$ in the "off" or high impedance region of its operating curve. When the input signal reaches a predetermined magnitude the junction switches to its "on" or low impedance state, as indicated by point $t$ on the curve. This change is accompanied by a substantial increase in current which is amplified between terminals $T_1$ and $T_2$ by the PNP junction sequence. If the magnitude of the input signal drops, the NPNP junction switches back "off."

It will be apparent to those skilled in the art that the above described circuit application is but one of many applications for the particular compound semiconductor disclosed herein and the numerous other compound semiconductors which can be manufactured in accordance with this invention. It will also be apparent that this invention provides a new class of multiple junction semiconductor devices which combine the electrical characteristics of two or more prior art devices in a single, integrated structure and a method of manufacturing such devices. And it should be understood that this invention is by no means limited to the specific structures disclosed herein since many variations can be made in the structure disclosed without departing from the basic teaching of this invention, which includes all modifications falling within the scope of the following claims.

We claim:

1. A method of manufacturing a PNP/NPNP compound semiconductor device comprising the steps of (A) placing a wafer of P type germanium in contact with a first and a second metallic material each containing N type impurities and P type impurities, the concentration of P type impurities being greater in one metallic material than the concentration of N type impurities therein, and the concentration of N type impurities being greater in the other metallic material than the concentration of P type impurities therein, (B) heating the three materials to a predetermined alloying temperature, (C) maintaining said materials at said alloying temperature for a predetermined length of time, (D) lowering the temperature of said materials to a predetermined diffusion temperature, (E) maintaining said materials at said diffusion temperature for a predetermined length of time to form a common layer of N type conductivity between each of said materials and said wafer, and (F) cooling the materials back to room temperature.

2. A method of manufacturing an NPN/PNPN compound semiconductor device comprising the steps of (A) placing a wafer of N type silicon in contact with a first and a second metallic material each containing N type impurities and P type impurities, one is P type metallic material and the other is N type, (B) heating the three materials to a predetermined alloying temperature, (C) maintaining said materials at said alloying temperature for a predetermined length of time, (D) lowering the temperature of said materials to a predetermined diffusion temperature, (E) maintaining said materials at said diffusion temperature for a predetermined length of time to form a common layer of P type conductivity between each of said materials and said wafer, and (F) cooling the materials back to room temperature.

3. A method of manufacturing compound semiconductor devices comprising the steps of (A) placing a semiconductor material selected from the group comprising P type germanium and N type silicon in contact with first and second spaced materials each containing N and P type impurities, the concentration of P type impurities being greater in one material than the concentration of N type impurities therein, and the concentration of N type impurities being greater in the other material than the concentration of P type impurities therein, (B) heating the materials to a predetermined alloying temperature, (C) maintaining said materials at said alloying temperature for a predetermined time to form recrystallized regions adjacent but out of contact with one another between the semiconductor material and each of said first and second materials, (D) maintaining said materials near said alloying temperature to form a layer of given conductivity type between said first and second semiconductor materials, and to form regions of alternate conductivity type between said second and said semiconductor materials wherein one region is of said given layer conductivity type and forms a continuous layer therewith, and (E) cooling said materials back to room temperature, whereby there is produced a semiconductor device with regions having a sequence selected from the group including a PNP/NPNP sequence and an NPN/PNPN sequence.

4. A PNP/NPNP compound semiconductor device comprising a first P type semiconductor region, a first N type semiconductor region forming a junction with said first P type semiconductor region, a second P type semiconductor region forming a junction with said first N type region, a third P type region forming a junction with said first N type region, a second N type region forming a junction with said third P type region, a first set of terminals including a first terminal connected to said first P type region and a second terminal connected to said second P type region, a second set of terminals including a third terminal connected to said second N type region, and a fourth terminal, said fourth terminal comprising either of the terminals of said first set, whereby electrical signals may be applied to one set of terminals to cause a change in the electrical condition between said other set of terminals.

5. An NPN/PNPN compound semiconductor device comprising a first N type semiconductor region, a first P type semiconductor region forming a junction with said first N type semiconductor region, a second N type semiconductor region forming a junction with said first P type region, a third N type region forming a junction with said first P type region, a second P type region forming a junction with said third N type region, a first set of terminals including a first terminal connected to said first N type region and a second terminal connected to said second N type region, a second set of terminals including a third terminal connected to said second P type region, and a fourth terminal, said fourth terminal comprising either of the terminals of said first set, whereby electrical signals may be applied to one set of terminals to cause a change in the electrical condition between said other set of terminals.

References Cited by the Examiner

UNITED STATES PATENTS

| | | | |
|---|---|---|---|
| 2,836,521 | 5/58 | Longini | 148—1.5 |
| 2,840,497 | 6/58 | Longini | 148—1.5 |
| 2,856,320 | 10/58 | Swanson | 148—185 X |
| 2,862,840 | 12/58 | Kordalewski | 148—15 |
| 2,943,006 | 6/60 | Henkels | 148—1.5 |
| 2,976,426 | 3/61 | Rappaport | 148—33.5 X |
| 2,993,154 | 7/61 | Goldey | 148—33.5 X |
| 3,010,857 | 11/61 | Nelson | 148—185 X |
| 3,029,170 | 4/62 | Lamming | 148—33 X |

OTHER REFERENCES

Proceedings of the IRE, Jochems et al., June 1958, relied on pages 1161–1165.

Lamming: Communication from the Staff of the Research Laboratories of the General Electric Co. Limited, Wembley, England. Pages relied on, 227–236.

DAVID L. RECK, *Primary Examiner.*

RAY K. WINDHAM, *Examiner.*